(12) United States Patent
Shi et al.

(10) Patent No.: US 8,722,467 B2
(45) Date of Patent: May 13, 2014

(54) METHOD OF USING BONDING BALL ARRAY AS HEIGHT KEEPER AND PASTE HOLDER IN SEMICONDUCTOR DEVICE PACKAGE

(75) Inventors: Lei Shi, Songjiang (CN); Aihua Lu, Songliang (CN); Yan Xun Xue, Los Gatos, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/539,304

(22) Filed: Jun. 30, 2012

(65) Prior Publication Data

US 2014/0001617 A1    Jan. 2, 2014

(51) Int. Cl.
*H01L 21/50* (2006.01)
*H01L 21/60* (2006.01)
*H01L 23/00* (2006.01)

(52) U.S. Cl.
CPC .............. *H01L 24/11* (2013.01); *H01L 24/14* (2013.01); *H01L 24/17* (2013.01)
USPC ........... 438/123; 438/118; 438/613; 257/676; 257/737; 257/738; 257/E21.506

(58) Field of Classification Search
CPC ......... H01L 24/10; H01L 24/11; H01L 24/14; H01L 24/17
USPC .......... 438/123, 612, 613, 119, 118; 257/676, 257/737, 738, E21.505, E21.506, E21.509, 257/E21.51, E21.511, E21.512, E21.514, 257/E23.023, E23.031, E23.124
See application file for complete search history.

(56) References Cited

U.S. PATENT DOCUMENTS

| | | | | | |
|---|---|---|---|---|---|
| 6,163,076 | A * | 12/2000 | Lee et al. | .............. | 257/777 |
| 6,630,372 | B2 * | 10/2003 | Ball | .............. | 438/123 |
| 6,635,957 | B2 * | 10/2003 | Kwan et al. | .............. | 257/691 |
| 6,815,833 | B2 * | 11/2004 | Lee et al. | .............. | 257/778 |
| 6,956,294 | B2 * | 10/2005 | Ball | .............. | 257/786 |
| 7,056,766 | B2 * | 6/2006 | Shiu et al. | .............. | 438/106 |
| 7,446,424 | B2 * | 11/2008 | Lu et al. | .............. | 257/783 |
| 7,633,144 | B1 * | 12/2009 | Kim et al. | .............. | 257/678 |
| 7,691,681 | B2 * | 4/2010 | Lee | .............. | 438/123 |
| 7,880,313 | B2 * | 2/2011 | Lee et al. | .............. | 257/778 |
| 8,063,313 | B2 * | 11/2011 | Oh et al. | .............. | 174/260 |
| 8,067,823 | B2 * | 11/2011 | Lee | .............. | 257/673 |
| 8,193,624 | B1 * | 6/2012 | Sohn | .............. | 257/686 |
| 8,361,899 | B2 * | 1/2013 | Jiang | .............. | 438/612 |
| 8,362,601 | B2 * | 1/2013 | Camacho et al. | .............. | 257/676 |
| 2001/0014538 | A1 * | 8/2001 | Kwan et al. | .............. | 438/690 |

(Continued)

*Primary Examiner* — Mary Wilczewski
(74) *Attorney, Agent, or Firm* — Chein-Hwa Tsao; CH Emily LLC

(57) ABSTRACT

A die attach method for a semiconductor chip with a back metal layer located at the back surface of the semiconductor chip comprises the steps of forming a bonding ball array including a plurality of bonding balls with a same height on a die attach area at a top surface of a die paddle; depositing a die attach material in the bonding ball array area with a thickness of the die attach material equal or slightly larger than the height of the bonding ball; attaching the semiconductor chip to the die attach area at the top surface of the die paddle by the die attach material, wherein the bonding ball array controls the bond line thickness of the die attach material between the back metal layer and the top surface of the die paddle and prevents the semiconductor chip from rotating on the die attach material when it is melted.

20 Claims, 5 Drawing Sheets

(56) References Cited

U.S. PATENT DOCUMENTS

| | | | |
|---|---|---|---|
| 2004/0089879 A1* | 5/2004 | Lee et al. | 257/200 |
| 2005/0046008 A1* | 3/2005 | Gai | 257/690 |
| 2005/0121756 A1* | 6/2005 | Chow et al. | 257/676 |
| 2006/0192294 A1* | 8/2006 | Lee | 257/778 |
| 2006/0192295 A1* | 8/2006 | Lee et al. | 257/778 |
| 2007/0057354 A1* | 3/2007 | Hinkle et al. | 257/676 |
| 2007/0212903 A1* | 9/2007 | Punzalan et al. | 439/70 |
| 2008/0006929 A1* | 1/2008 | Punzalan et al. | 257/692 |
| 2008/0299705 A1* | 12/2008 | Lee | 438/108 |
| 2009/0026594 A1* | 1/2009 | Yee et al. | 257/676 |
| 2009/0179335 A1* | 7/2009 | Oh et al. | 257/783 |
| 2010/0140764 A1* | 6/2010 | Camacho et al. | 257/676 |
| 2011/0108970 A1* | 5/2011 | Lee et al. | 257/676 |
| 2014/0004662 A1* | 1/2014 | Jiang | 438/123 |

* cited by examiner

METHOD OF USING BONDING BALL ARRAY AS HEIGHT KEEPER AND PASTE HOLDER IN SEMICONDUCTOR DEVICE PACKAGE

FIELD OF THE INVENTION

The invention generally relates to semiconductor power device attach process, particularly, the invention relates to a method using a bonding ball array as a height keeper and paste holder in a die attach process.

DESCRIPTION OF THE RELATED ART

In the step of attaching a semiconductor chip to a lead frame, the bond line thickness control is very important when a die attach material, such as soft solder, soldering paste or conductive silver paste, is applied in the semiconductor power device attach process. The bond line thickness of the solder is affected by many factors, such as compositions and surface roughness of the metal at the backside of the chip, solder wetting, or surface cleanliness of the lead frame. It is complicated to control the bond line thickness of the solder, which also causes problems of reliability of the power device.

In a cross-sectional view as shown in FIG. 1A, a semiconductor chip 102 is attached on a die paddle 100 by a die attach material 101, such as solder, of a designed thickness $D_1$ coating at the top surface of the substrate 100. However, in the actual production, the solder 101 is melted in the reflow step, resulting in a dense and rough melted solder pool. When the chip 102 is attached on the melted solder pool, the chip 102 can be partially submerged in the melted solder pool. As a result, as shown in FIG. 1B, the distance $D_2$ from the bottom surface of the chip 102 to the top surface of the die paddle 100 is shorter than the designed thickness $D_1$. Furthermore, the melted solder 101 can overflow onto the front surface of the chip along the side wall of the chip, which damages the integrated circuit unit at the front surface of the chip or results in short circuit. As a result, the reliability of the chip 102 is affected.

In addition, the chip 102 can float in the melted solder pool. As shown in FIG. 1C, which is a top view of the structure shown in FIG. 1B, if the size of the chip is smaller than that of the melted solder pool, the chip 102 can rotate in the melted solder pool caused by the surface tension of the solder when the solder is melted. Generally, the chip 102 includes a plurality of I/O pads 102a located at the front surface of the chip 102 functioning as the electrodes of the chip or the terminals for signal transmission with the outside circuit. When the chip 102 rotates relatively to the substrate 100, the I/O pads 102a are shifted correspondingly. As a result, in the process of wire bonding the chip to a lead frame unit, in which bonding wires are bonded on the I/O pad 102a, the bonding wires cannot be precisely bonded on the I/O pad 102a, or the bonding wire may be bonded on the passivating layer surrounding the I/O pad 102a, which will damage the integrated circuit unit on the chip.

The existing technology has provided certain approaches for solving the above problems, for example, a special soft solder, such as Pb5Sn2.5Ag0.05Te, is developed to improve the bond line thickness control. Wafer bumping design is another approach to improve bond line thickness control in flip chip package. Another approach is forming a coating layer covering the surface of the lead frame to limit the solder wetting to prevent the chip from the rotation. However, these methods are high cost and not effective.

It is within this context that embodiments of the present invention arise.

BRIEF DESCRIPTION OF THE DRAWINGS

As shown in attached figures, the embodiment of the invention is more sufficiently described. However, the attached drawing is only used for explaining and illustrating rather than limiting the range of the invention.

DETAILED DESCRIPTION OF THE PREFERRED EMBODIMENTS

Figure 1A:
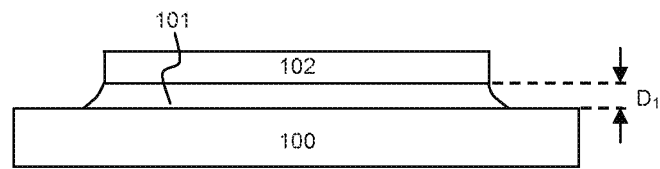
FIGS. 1A-1C are schematic diagrams illustrating a process of attaching a semiconductor chip on a die paddle in the prior art.
Figure 1B:
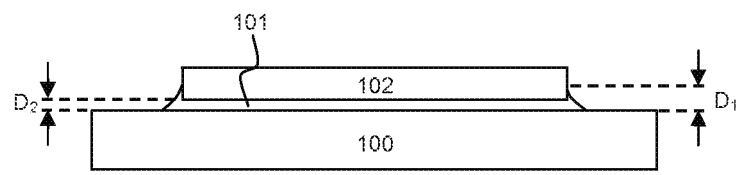
Figure 1C:
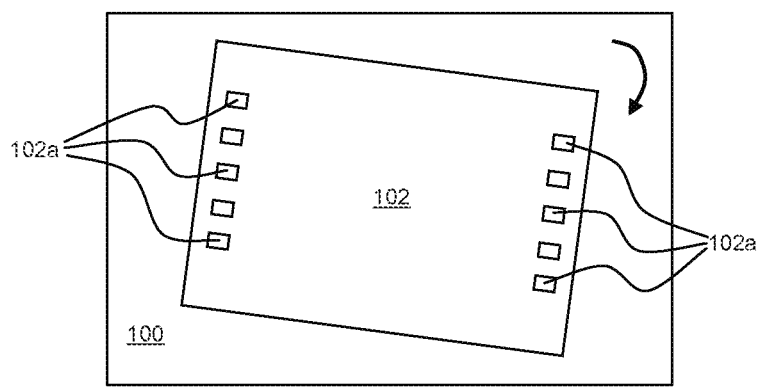
Figure 2A:
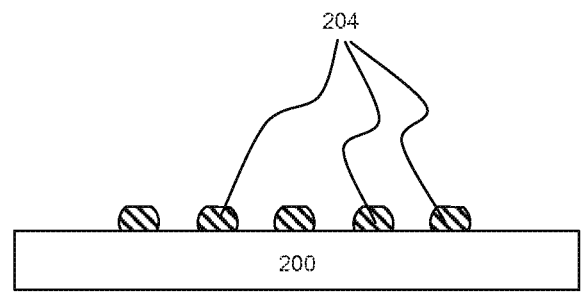
FIGS. 2A-2F are schematic diagrams illustrating a die attach method of the present invention.
Figure 2B:
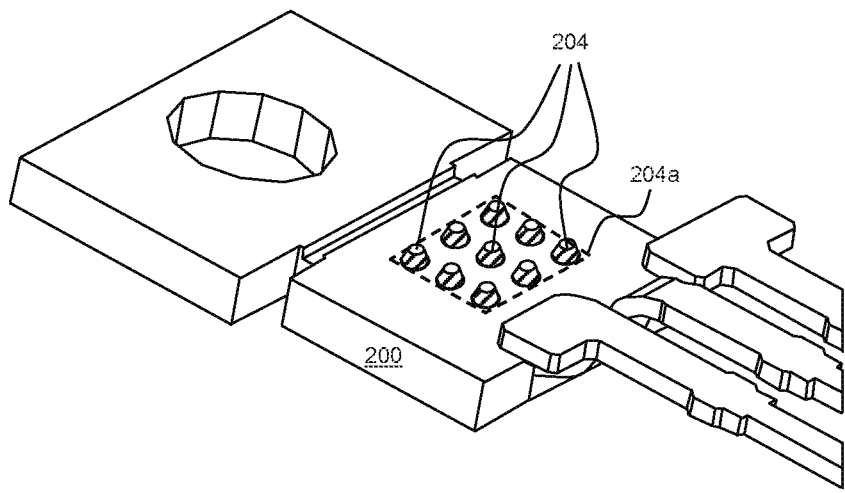

Usually, a lead frame strip includes a plurality of lead frame units, each of which includes a die paddle 200 as shown in FIGS. 2A-2B. For a high power consumption and high radiation power device, the die paddle 200 commonly has excellent thermal and electrical conductivity; for example, the die paddle is made of (but not limited to) copper or copper alloy. According to a preferred embodiment of the present invention, a bonding ball array including a plurality of bonding balls 204 of the same height is formed on a die attach region (not shown) at the top surface of the die paddle 200. The bonding ball array is arranged similar to the shape of the semiconductor chip, for example, the bonding ball array can be arranged in a rectangular shape (as shown in FIG. 2B), but it also can be arranged in different shapes, such as triangle, quadrilateral, round (ellipse), sector or other arbitrary polygon. Optionally, before the bonding balls 204 are formed, a thin metal coating, which is made of (but not limited to) gold, silver, nickel, nickel palladium alloy and the like, can be formed to cover the die attach region. Alternatively, an anti-oxidation metal or alloy is also suitable material for forming the coating.

In the present invention, the bonding balls 204 are made of a conductive material, such as copper (preferably), gold, silver, aluminum or other metals and their alloy. In addition, the selection of the material for the bonding balls 204 depends on the die attach materials 201 (shown in FIG. 2C) applied in the die attach process. It is required that the melting point of the bonding ball 204 is slightly higher than that of the die attach material 201 so that the bonding ball 204 will not be melted when the die attach material 201 is melted in the reflow process. Alternatively, if the die attach material 201 is electrically conductive, the bonding ball 204 can be made of semiconductor material or insulator material with its melting point being higher than that of the die attach material 201. Furthermore, the bonding ball 204 can be in ellipse shape, cube shape, column shape, or wedge shape.

Figure 2C:
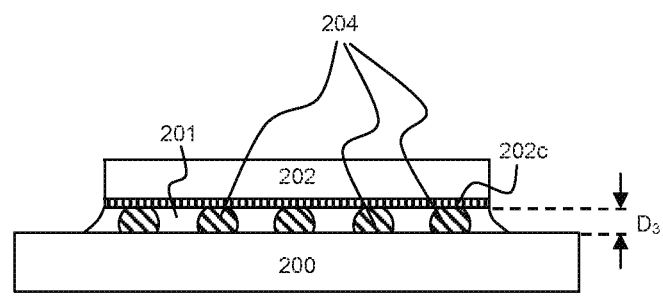
Figure 2D:
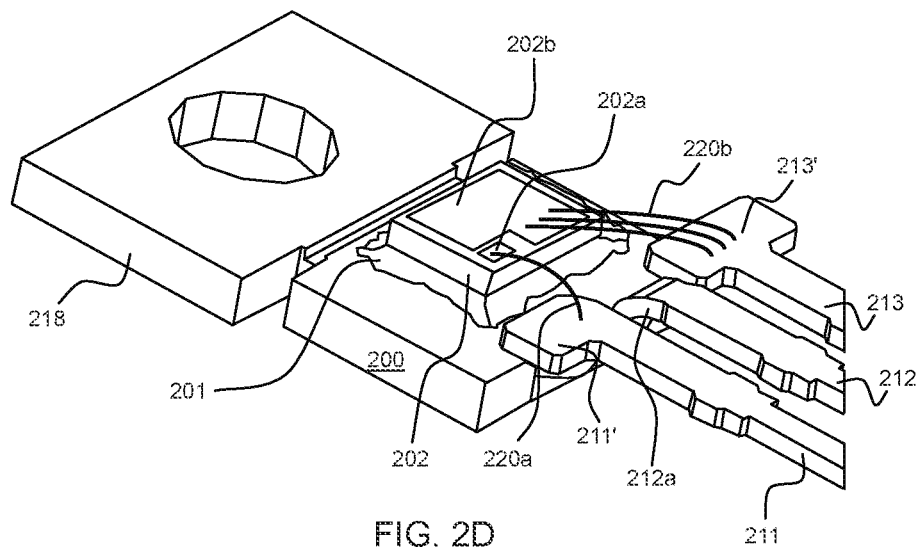

In one embodiment, as shown in FIG. 2C, when the chip 202 is a vertical semiconductor power device, i.e., the current flows from the front surface to the back surface of the chip or vice versa, the back metal layer 202c forms the bottom electrode at the back surface of the chip 202 and the I/O pads (not shown) form the top electrodes at the front surface of the chip 202. In one embodiment, when the chip 202, as shown in FIG. 2D, is a Metal-Oxide-Semiconductor Field Effect Transistor (MOSFET), the I/O pads 202a and 202b at the front surface of the MOSFET form the gate and source electrodes of the chip respectively and the back metal layer 202c at the back surface of the MOSFET forms the drain electrode of the chip. In one embodiment, the back metal layer 202c covers the whole back surface of the chip 202, i.e., the area of the back metal layer 202c is equal to the area of the back surface of the chip 202. As shown in FIG. 2C, after forming the bonding ball array on the top surface of the die paddle 200, die attach material 201 is deposited to cover the top surface of the die paddle 200 and to encapsulate the bonding balls 204 in the die attach region. The shape and the size of the die attach material 201 are controlled by the shape and size of the bonding ball array. The thickness of the die attach material 201 can be higher than the height of the bonding ball 204 to form a strong physically support between the chip and the die paddle. In particular, the thickness of the die attach material 201 may be slightly higher than the height of the bonding ball 204, so that the die attach material 201 can encapsulate the bonding ball 204 properly.

The die attach process is then carried out to attach the chip 202 in the die attach region on the die paddle 200 utilizing the die attach material. As a result, the bonding ball array and the die attach material 201 are properly located between the back metal layer 202c of the chip 202 and the top surface of the die paddle 200. The die attach material 201 can be a conductive silver paste, a soft solder, a lead or leadless soldering paste and the like. If the soft solder or the soldering paste is used, it is then reflowed, and if the conductive silver paste is used, it is cured instead. In the die attach step, when the thickness of the die attach material 201 is slightly higher than the height of the bonding ball 204, the chip 202 will be slightly submerged in the melted die attach material 201 until the back metal layer 202c is contacted with and is supported by the bonding balls 204. When the thickness of the die attach material 201 is equal to the height of the bonding balls 204, the back metal layer 202c is directly contacted with the bonding balls 204. In any case, the height of the die attach material after cure would not be higher than the height of the bonding balls 204.

In a preferred embodiment, the contact area of the bonding ball array and the die attach material are designed to be the same as that of the back layer 202c. The bonding ball array prevents the chip from being submerged in the melted die attach material in the reflow process, therefore the thickness $D_3$ of the sequential material 201 between the back metal layer 202c and the top surface of the die paddle 200, which is the height of the bonding ball 204, is effectively controlled. On the other hand, the bonding ball array is also used for holding the die attach material 201, so that the tension effect during the melting of the die attach material is reduced. As a result, the back metal layer 202c of the chip 202 is attached to the die attach material 201, thus preventing the chip from rotating in the melted die attach material 201.

FIG. 2D is a perspective view illustrating a portion of a lead frame unit. The lead frame unit includes the die paddle 200, a pin 212 connected to the die paddle 200 at a bent-downward connecting part 212a and pins 211 and 213 positioned close to the die paddle 200 but separated from the die paddle 200. The pins 211, 212 and 213 are arranged into a row on the same plane above the top surface of the die paddle 200 at the same side of the die paddle 200. The pins 211 and 213 are located at two opposite sides of the pin 212, all of which are parallel to each other. The pins 211 and 213 include connecting parts 211' and 213' respectively, which are located close to the die paddle 200. The connecting parts 211' and 213' extend a along the edge of the die paddle 200, resulting in a large area for attaching of the bonding wire. In addition, the lead frame unit also includes a heat sink 218 directly connecting to the die paddle 200 on the opposite side with the pins 211, 212 and 213 for heat dissipation. Usually, the die paddle 200 and the pins 211, 212 and 213 are directly connected to the lead frame strip or are connected to the lead frame strip through connecting bars (not shown). The I/O pad 202a can be electrically connected to the bonding part 211' by the bonding wire 220a, and the I/O pad 202b can be electrically connected to the connecting part 213' by a plurality of bonding wires 220b.

Figure 2E:
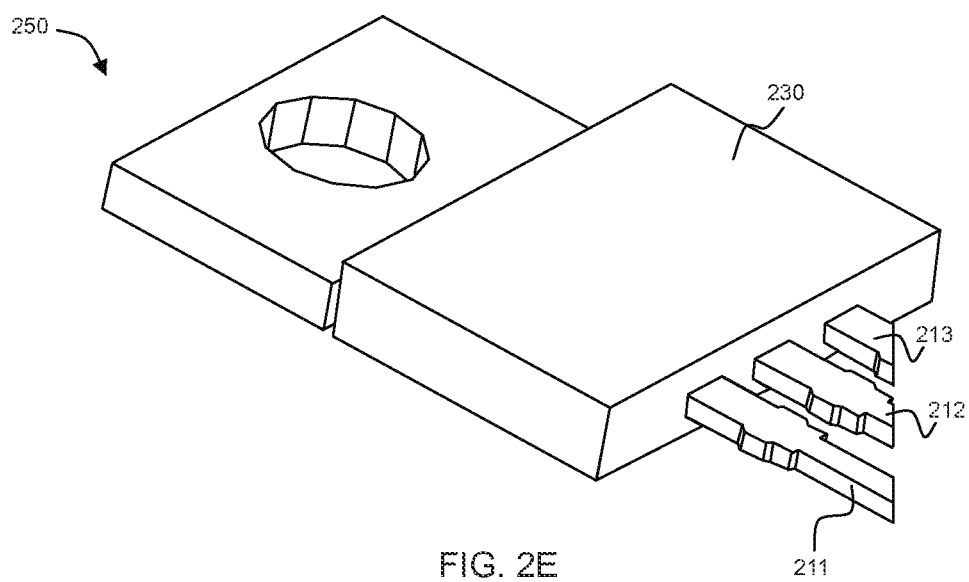
Figure 2F:
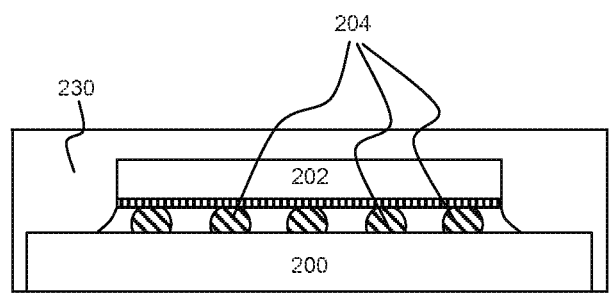

As shown in FIGS. 2E-2F, to complete a power device 250, a plastic package material, such as epoxy resin and the like, is deposited to form a plastic package body 230 encapsulating the die paddle 200, the chip 202, the connecting parts 211', 212a and 213' and bonding wires 220a and 220b with the bottom surface of the die paddle 200 exposed from the plastic package body 230 for heat dissipation. The pins 211, 212 and 213 extend out of the plastic package body 230.

Figure 3A:
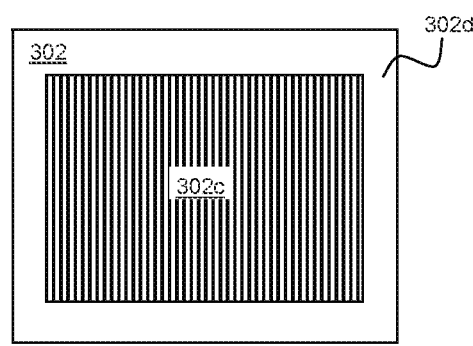
FIGS. 3A-3D are schematic diagrams illustrating another die attach method of the present invention.
Figure 3B:
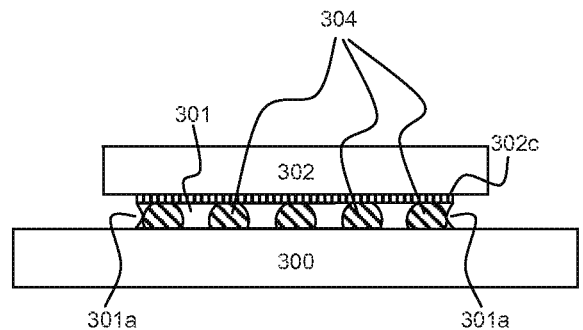
Figure 3C:
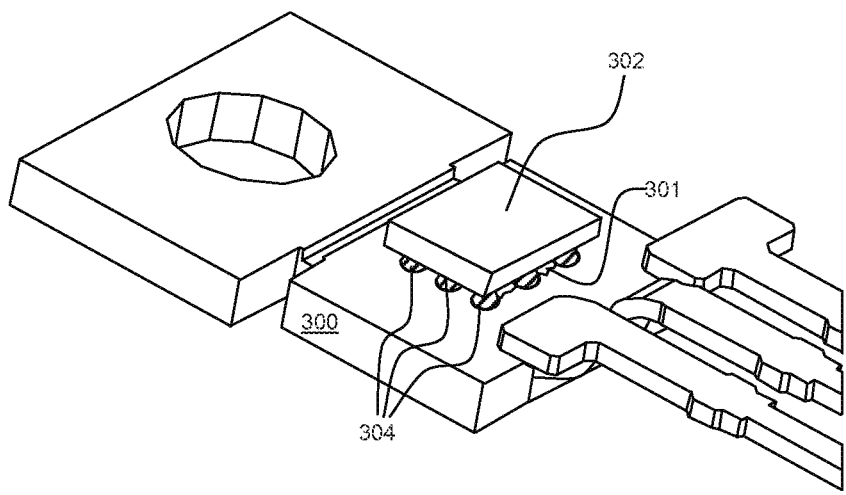

The device structure described in FIGS. 2A-2F is an example illustrating the embodiment of the present invention. Both the quantity and the position of the pins formed close to the die paddle 200 can be properly adjusted depending on the type of the chip and the application of the power device; therefore FIG. 2D and FIG. 3C are only used for illustrating the application but not limiting the scope of the present invention.

In one embodiment of the present invention, for certain special semiconductor chip types such as a gallium arsenide (GaAs) semiconductor power device, the back metal layer only covers a center portion of the back surface of the chip and does not cover the edge portion of the back surface of the chip. As shown in FIGS. 3A-3B, a back metal layer 302c is formed at the back surface of the chip 302 to form the bottom electrode and the I/O pads (not shown) are formed at the front surface of the chip 302 to form the top electrodes. Differing from the chip 202, the back surface of the chip 302 is not completely covered by the back metal layer 302c. From a bottom view of the back surface of the chip 302 as shown in FIG. 3A, non-back metal ring 302d around the edge at the back surface of the chip 302 is not covered by the back metal layer 302c. The non-back metal ring 302d must be electrically insulated from the die attach material 301, the bonding balls 304 and the die paddle 300 to prevent short circuit. In this embodiment, the bonding ball array is only formed on the top surface of the die paddle 300 in an area overlapped by the back metal layer 302c. In particular, the bonding ball array is only located below the back metal layer 302c and cannot extend below the non-back metal ring 302d at the back surface of the chip 302 to prevent the bonding balls 304 and the die attach material 301 from electrically connecting to the non-back metal ring 302d. As the die attach material 301 is deposited properly, it does not extend out of the bonding ball array area, for example the die attach material occupies the whole bonding ball array area or only a portion of the bonding ball array area; therefore, the die attach material 201 is hold within the bonding ball array area, which is especially important when the die attach material 201 is melted. Furthermore, as shown in FIGS. 3B-3C, the outer bonding balls 304 minimizes the surface tension at the side wall surface of the die attach material 301, as such the side wall surface 301a of die attach material 301 is concave, which further prevents the die attach material 301 from electrically connecting to the non-back metal ring 302d.

Figure 3D:
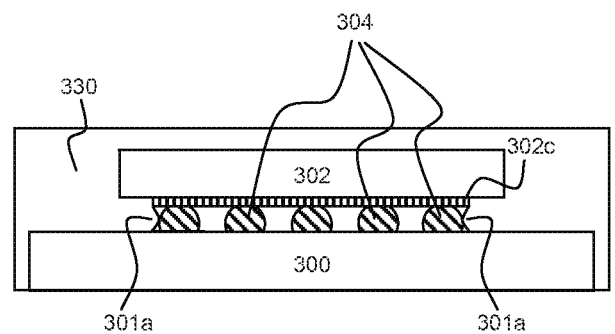

In the subsequent plastic packaging step, as shown in FIG. 3D, a plastic packaging material is deposited to form the plastic packaging body 330 and to fill into a gap between the non-back metal ring 302d and the top surface of the die paddle 300; as such, the non-back metal ring 302d is electrically insulated from the bonding ball 304, the die attach material 301 and the die paddle 300.

Figure 4A:
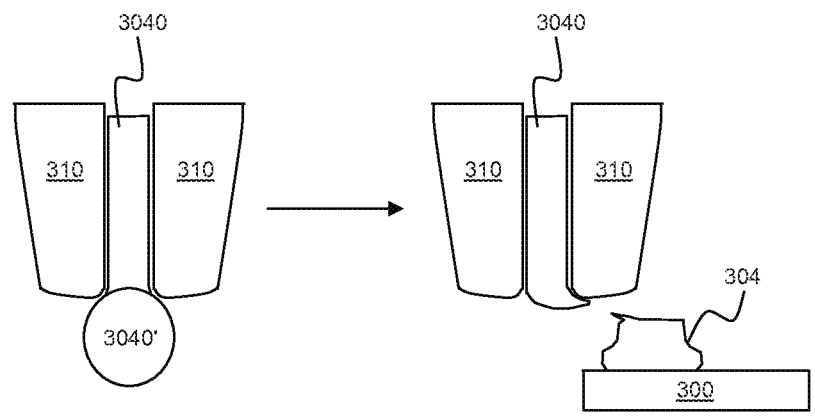
FIGS. 4A-4B are schematic diagrams illustrating a method for preparing a bonding ball array.
Figure 4B:
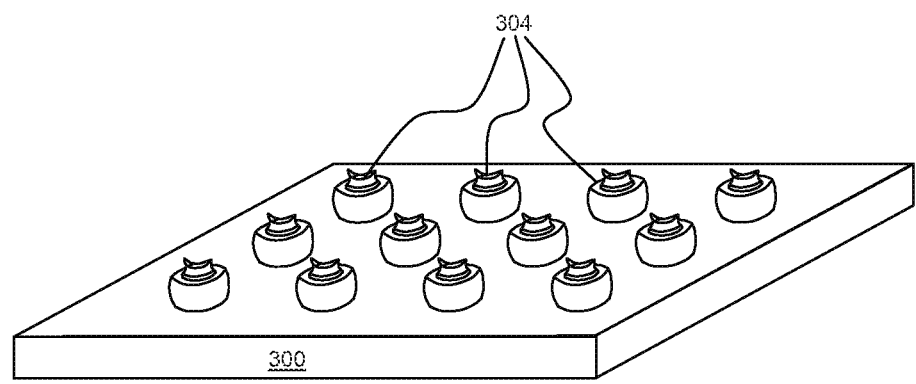

FIGS. 4A-4B illustrate one example of a method for forming an array of bonding balls 304 on the die attach area on a die paddle 300. As shown in FIG. 4A, a capillary tube is arranged inside a bonding tool 310, commonly used in wire bonding equipment, to hold a metal wire 3040. The part of the metal wire 3040 coming out at the end of the capillary tube of bonding tool 310 is heated to melt by hydrogen and oxygen flame and then is solidified to generate a metal sphere 3040'. The diameter of the metal sphere 3040' is preferably two or three times of the diameter of the metal wire 3040. In this step, the bonding tool 310 forms the metal sphere 3040' from the metal wire 3040, then the metal sphere 3040' is placed on the die attach area of the die paddle 300 forming the bonding ball 304 (as shown in FIG. 4A). Then, the bonding tool 310 is quickly lifted upward from the die paddle 300 to break the metal wire 3040 from the bonding ball 304. This step is repeated to form an array of bonding balls 304 on the top surface of the die paddle 300 as shown in FIG. 4B. The diameter of the bonding ball 304 can be changed by adjusting the diameter of the metal wire 3040 to optimize the bonding line thickness control of the die attach material 301.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A die attach method for a semiconductor chip including a back metal layer located at the back surface of the semiconductor chip comprising:
   forming a bonding bump array including a plurality of bonding bumps with a same height on a die attach area at a top surface of a die paddle;
   depositing a die attach material in the bonding bump array area with a thickness of the die attach material equal or slightly larger than the height of the bonding bump;
   attaching the semiconductor chip to the bonding bump array at the top surface of the die paddle by the die attach material, wherein the die attach material and the bonding bump array are located between the back metal layer of the semiconductor chip and the top surface of the die paddle
   wherein the bonding bump array controls a bond line thickness of the die attach material between the back metal layer and the top surface of the die paddle and prevents the semiconductor chip from rotating on the die attach material when the die attach material is melted.

2. The method of claim 1, wherein the bonding bump array has a shape of a rectangle, triangle, quadrangle, round, ellipse, sector or any polygon.

3. The method of claim 1, wherein the shape and an area of the bonding bump array are the same as those of the back metal layer.

4. The method of claim 1, wherein a melting point of the bonding bump is higher than a melting point of the die attach material.

5. The method of claim 1, wherein the bonding bump comprises a conductor, an insulator or a semiconductor.

6. The method of claim 1, wherein the bonding bump is made of copper, gold, silver, aluminum or their alloy.

7. The method of claim 1, wherein the bonding bump has a shape of sphere, ellipse, cube, cylinder or wedge.

8. The method of claim 1, wherein the die attach material comprises a conductive silver paste, a soft solder or a soldering paste.

9. The method of claim 1, wherein a metal coating is formed in the die attach area at the top surface of the die paddle before forming the bonding bumps, the metal coating is made of gold, silver, nickel or nickel-palladium-gold.

10. A die attach method for a semiconductor chip including a back metal layer located at the back surface of the semiconductor chip comprising:
    forming a bonding bump array including a plurality of bonding bumps with a same height on a die attach area at a top surface of a die paddle;
    depositing a die attach material in the bonding bump array area with a thickness of the die attach material equal or slightly larger than the height of the bonding bump;
    attaching the semiconductor chip to the bonding bump array at the top surface of the die paddle by the die attach material, wherein the die attach material and the bonding bump array are located between the back metal layer of the semiconductor chip and the top surface of the die paddle
    wherein the bonding bump array controls a bond line thickness of the die attach material between the back metal layer and the top surface of the die paddle and prevents the semiconductor chip from rotating on the die attach material when the die attach material is melted; and
    wherein the step of forming the bonding ball array comprises:
    a) forming a metal sphere by heating an end part of a metal wire and depositing the metal sphere in the die attach area;
    b) separating the metal sphere from the metal wire forming a bonding ball in the die attach area; and
    repeating steps a) and b) to generate a plurality of bonding balls in the die attach area forming the bonding ball array
    wherein the diameter of the bonding ball is adjusted by changing the diameter of the metal wire, as such the thickness of the die attach material between the back metal layer of the semiconductor chip and the top surface of the metal substrate can be controlled.

11. The method of claim 1, wherein the back metal layer covers the whole back surface of the semiconductor chip.

12. The method claim 1, the back metal layer covers a center portion of the back surface of the semiconductor chip.

13. The method of claim 12, wherein the bonding balls in the bonding ball array are only formed within an area at the top surface of the die paddle overlapped by the back metal layer.

14. A die attach method for a semiconductor chip including a back metal layer located at the back surface of the semiconductor chip comprising:
    providing a lead frame having a bonding bump array including a plurality of bonding bumps with a same height formed on a die attach area at a top surface of a die paddle;
    depositing a die attach material in the bonding bump array area with a thickness of the die attach material equal or slightly larger than the height of the bonding bump;
    attaching the semiconductor chip to the bonding bump array at the top surface of the die paddle by the die attach material, wherein the die attach material and the bonding bump array are located between the back metal layer of the semiconductor chip and the top surface of the die paddle
    wherein the bonding bump array controls a bond line thickness of the die attach material between the back metal layer and the top surface of the die paddle and prevents the semiconductor chip from rotating on the die attach material when the die attach material is melted.

15. The method of claim 14, wherein the bonding bump array has a shape of a rectangle, triangle, quadrangle, round, ellipse, sector or any polygon.

16. The method of claim 14, wherein the shape and an area of the bonding bump array are the same as those of the back metal layer.

17. The method of claim 14, wherein a melting point of the bonding bump is higher than a melting point of the die attach material.

18. The method of claim 14, wherein the bonding bump comprises a conductor, an insulator or a semiconductor.

19. The method of claim 14, wherein the bonding bump is made of copper, gold, silver, aluminum or their alloy.

20. The method of claim 14, wherein the bonding bump has a shape of sphere, ellipse, cube, cylinder or wedge.

\* \* \* \* \*